United States Patent [19]

Liu

[11] Patent Number: 5,656,509
[45] Date of Patent: Aug. 12, 1997

[54] METHOD AND TEST STRUCTURE FOR DETERMINING GOUGING IN A FLASH EPROM CELL DURING SAS ETCH

[75] Inventor: David K. Y. Liu, Cupertino, Calif.

[73] Assignee: Advanced Micro Devices, Inc., Sunnyvale, Calif.

[21] Appl. No.: 438,434

[22] Filed: May 10, 1995

[51] Int. Cl.⁶ .................................................. H01L 21/66
[52] U.S. Cl. ............................................................ 438/18
[58] Field of Search ............................ 437/7, 8, 43, 74; 148/DIG. 162

[56] References Cited

U.S. PATENT DOCUMENTS

| | | | |
|---|---|---|---|
| 5,057,462 | 10/1991 | Eisenberg et al. | 437/229 |
| 5,120,671 | 6/1992 | Tang et al. | 437/43 |
| 5,264,377 | 11/1993 | Chesire et al. | 437/8 |
| 5,381,105 | 1/1995 | Phipps | 437/8 |
| 5,470,773 | 11/1995 | Liu et al. | 437/43 |

*Primary Examiner*—Chandra Chaudhari
*Attorney, Agent, or Firm*—Benman Collins & Sawyer

[57] ABSTRACT

In one aspect of the present invention, a method includes the steps of providing a first test cell electrically isolated from the substrate, unexposed to the SAS etch and having a first core profile. The method further includes providing a second test cell electrically isolated from the substrate, exposed to the SAS etch, and having a second core profile. Additionally, the method includes performing the SAS etch, measuring electrical characteristics of the first and second cells, and comparing the measured electrical characteristics to determine an amount of gouging. In a further aspect of the present invention, a method includes the steps of forming a pair of test structures in electrical isolation of a substrate of the cell, and measuring resistance values for each of the pair of test structures to determine the amount of gouging. In addition, the method includes protecting one of the pair of test structures from the SAS etch.

6 Claims, 1 Drawing Sheet

METHOD AND TEST STRUCTURE FOR DETERMINING GOUGING IN A FLASH EPROM CELL DURING SAS ETCH

FIELD OF THE INVENTION

The present invention relates to Flash EPROM cell structures, and more particularly to test structures and methods for determining an amount of gouging of Flash EPROM cell structures due to self-aligned-source (SAS) etching.

BACKGROUND OF THE INVENTION

For typical Flash EPROM (erasable programmable read only memory) formation, a self-aligned-source (SAS) etch process is used. An example of a SAS process includes U.S. Pat. No. 5,120,671, entitled "Process for Self Aligning a Source Region with a Field Oxide Region and a Polysilicon Gate". With the SAS etch process, a field oxide of the EPROM cell is etched away and a source line is formed that is self-aligned to the stacked gate of the EPROM cell and eliminates the need for an overlap of the field oxide area of the stacked gate. By using this process, the stacked gates are suitably formed close together resulting in a significant reduction in core cell area. Further, with the reduction in core cell area, the density of Flash EPROM cells is increased, thus making the SAS etch process a mainstay in nearly all current Flash EPROM cell formation processes.

Unfortunately, the SAS etch process also potentially affects the integrity of the silicon substrate of the cell. The selectivity in etch rates between the silicon of the substrate and the field oxide largely determines the amount of silicon unintentionally etched during the SAS etch process. Some of the undesirable effects or negative impacts of such gouging in the silicon substrate on the core cell array characteristics include poor erase distribution, slow erase speed, higher column leakage, and more erratic bits. Hence, it is considered highly important to monitor the gouging. Heretofore, attempts to monitor gouging have typically used destructive techniques, such as SEM or TEM cross-sectional methods.

What is needed is a test method used to determine the amount of gouging that occurs during SAS etch and that can be incorporated into the typical, electrical, wafer level testing routines.

SUMMARY OF THE INVENTION

The present invention provides methods for determining the amount of gouging in a substrate of a Flash EPROM cell during a self-aligned source (SAS) etch. In one aspect of the present invention, a method includes the steps of providing a first test cell electrically isolated from the substrate, unexposed to the SAS etch and having a first core profile. The method further includes providing a second test cell electrically isolated from the substrate, exposed to the SAS etch, and having a second core profile. Additionally, the method includes performing the SAS etch, measuring electrical characteristics of the first and second cells, and comparing the measured electrical characteristics to determine an amount of gouging.

Other aspects of the method include providing contact points in the first and second test cells for use during the step of measuring, and performing a p-type doping in the first and second test cells to form the contact points. The step of measuring further includes measuring a resistance value across each cell during electrical testing, and the step of comparing further includes determining an amount of gouging in the Flash EPROM cell from the measured resistance values. Further, the first test cell and the second test cell are electrically isolated in an N-Well in the substrate.

In a further aspect of the present invention, a method includes the steps of forming a pair of test structures in electrical isolation of a substrate of the cell, and measuring resistance values for each of the pair of test structures after completion of cell formation to determine the amount of gouging that occurred during the SAS etch. In addition, the method includes protecting one of the pair of test structures from the SAS etch, electrically isolating the pair of test structures in an N-Well of the substrate, and forming contact points in each of the test structures with a p-type dopant for use in the step of measuring.

With the present invention, the amount of gouging in the substrate of a Flash EPROM cell can be determined using a nondestructive, electrical contact technique that can be readily incorporated into the electrical testing routines of fabrication processing. The present invention takes to advantage the relationship between junction depth and resistance in determining the amount of gouging. These and other advantages of the aspects of the present invention will be more fully understood in conjunction with the following detailed description and accompanying drawings.

DETAILED DESCRIPTION

The present invention relates to a set of test structures used in determining gouging of a silicon substrate during SAS etch of a Flash EPROM cell. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
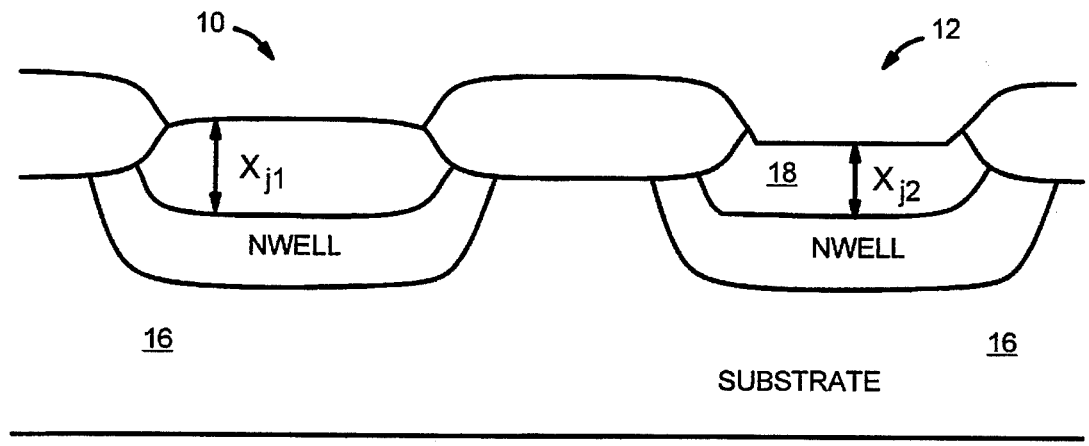
FIG. 1 illustrates a set of test structures in accordance with the present invention.

FIG. 1 illustrates a test cell arrangement that includes a pair of test cell structures, 10 and 12, formed in accordance with present invention. Test cell structures 10 and 12 are formed with a channel profile that duplicates the channel profile of a typical Flash EPROM core cell with an exception. The channel profiles of test cell structures 10 and 12 are preferably formed in the DNWell or regular N-Well existing in the Flash EPROM process, as is well appreciated by those skilled in the art. By placing the test cell structures 10 and 12 into the N-Well portions 14 of the substrate 16, the core profile of each cell 10 and 12 is electrically isolated from the substrate 16.

When performing the SAS etch on an array of Flash EPROM cells, preferably one of the test cell structures 10 or 12 is protected during the SAS etch, while the remaining test structure 10 or 12 is exposed to the SAS etch. For the purpose of this disclosure, test cell structure 10 is considered the test cell structure that is kept protected during the SAS etch. Following the SAS etch, however, both test cell structures 10 and 12 are protected from any subsequent implants until formation of contact points to the test cell structures 10 and 12, as described subsequently in more detail with reference to FIG. 2.

As shown by FIG. 1, the core implant 18 of the test cell structure 12 left exposed to the SAS etch is gouged, i.e., a portion of the core implant 18 is etched away, during the SAS etch. The junction depth, $X_{j1}$, of test cell structure 10 as compared with the junction depth, $X_{j2}$, of test cell structure 12 further indicates the amount of gouging that occurred to the core implant 18 from the SAS etch.

As is well known to those skilled in the art and as shown by the following equations, the resistance of a cell structure is inversely proportional to the junction depth of the core channel profile.

Figure 2:
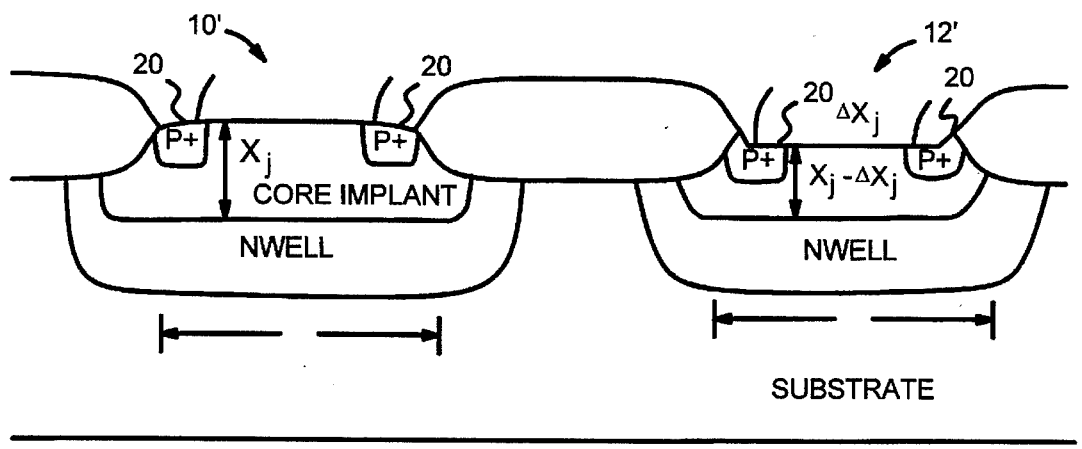
FIG. 2 illustrates the test structures of FIG. 1 modified for electrical testing in accordance with the present invention.

(1) $R=\rho L/X_j$, where $\rho$ is the resistivity of the cell, and L is the length of the cell as indicated in FIG. 2. The present invention utilizes the relationship between resistance and junction depth for each test cell structure 10 and 12 to determine the amount of gouging from the SAS etch. A comparison of the resistance $R_{SAS}$ for the test cell structure exposed to the SAS etch with the resistance $R_{no-SAS}$ for the test cell structure 10 protected from the SAS etch, results in a determination of a change in junction depth, $\Delta X_j$, as show, by the following.

(2) $R_{SAS}/R_{no-SAS}=X_j/(X_j-\Delta X_j)$, so that (3) $\Delta X_j=X_j(R_{SAS}-R_{no-SAS})/R_{SAS}$, where $R_{SAS}=\rho L/X_{j2}$, $R_{no-SAS}=\rho L/X_{j1}$, $X_j=X_{j1}$, and $X_{j2}=X_j-\Delta X_j$, as indicated in FIG. 2.

In determining the resistance of structures 10 and 12, a p-type doping is performed in the core implant 18 to form contact points for the test structures 10 and 12, resulting in structures 10' and 12', as illustrated in FIG. 2. The details of performing a p-type doping to produce p+ regions 20 in the cell structures 10' and 12' are well known to those skilled in the art. With the formation of structures 10' and 12', a resistance value is obtained through electrical testing of each structure, as is well understood by one of skill in the art. In accordance with equation (3), using the resistance values obtained for the electrical testing, the amount of gouging, $\Delta X_j$, is determined. Of course, calculation of the gouging amount may be performed by any suitable method, such as through the use of a microcomputer.

With the present invention, the detrimental effects of gouging of the core implant from SAS etch techniques are easily and non-invasively determined during electrical testing routines following completion of cell formation. Further, by electrically isolating the test structures 10 and 12 in an N-Well of the substrate in accordance with the present invention, formation of resistive structures 10' and 12' is more readily accomplished. Thus, the measurement of the resistances of the structures for use in determining the amount of gouging is readily performed.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined solely by the following claims.

I claim:

1. A method for determining an amount of gouging in a substrate of a Flash EPROM cell during a self-aligned-source (SAS) etch of the Flash EPROM cell, the method comprising:

(a) providing a first test cell, the first test cell electrically isolated from the substrate, unexposed to the SAS etch, and having a first core profile;

(b) providing a second test cell, the second test cell electrically isolated from the substrate, exposed to the SAS etch, and having a second core profile;

(c) performing a p-type doping in the first and second test cells to form contact points in the first and second test cells;

(d) performing the SAS etch;

(e) measuring an electrical characteristic of each of the first and second test cells using the contact points; and (f) comparing the measured electrical characteristic of the first core cell and the second core cell to determine an amount of gouging.

2. A method for determining the amount of gouging produced during a self-aligned-source (SAS) etch of a Flash EPROM cell structure, the method comprising:

(a) forming a pair of test structures in electrical isolation of a substrate of the cell, wherein the pair of test structures are electrically isolated in an N-Well of the substrate;

(b) forming contact points in each of the test structures with a p-type dopant; and (c) measuring resistance values for each of the pair of test structures, by using the contact points, after completion of cell formation to determine the amount of gouging that occurred during the SAS etch.

3. The method of claim 1 wherein the step of measuring further comprises measuring a resistance value across each cell during electrical testing.

4. The method of claim 3 wherein the step of comparing further comprises determining an amount of gouging in the Flash EPROM cell from the measured resistance values.

5. The method of claim 1 wherein the first test cell and the second test cell are electrically isolated in an N-Well in the substrate.

6. The method of claim 2 further comprising protecting one of the pair of test structures from the SAS etch.

* * * * *